United States Patent [19]
Culp

[11] Patent Number: 5,939,816
[45] Date of Patent: Aug. 17, 1999

[54] PIEZOELECTRIC ACTUATOR

[75] Inventor: Gordon W. Culp, Van Nuys, Calif.

[73] Assignee: Rockwell International Corporation, Costa Mesa, Calif.

[21] Appl. No.: 08/265,561

[22] Filed: Jun. 24, 1994

Related U.S. Application Data

[60] Continuation of application No. 07/414,176, Sep. 28, 1989, abandoned, which is a division of application No. 07/252,197, Sep. 30, 1988, Pat. No. 4,928,030.

[51] Int. Cl.⁶ .................................................. H01L 41/08
[52] U.S. Cl. .......................... 310/328; 310/366; 310/333
[58] Field of Search ..................................... 310/323, 328, 310/366, 317, 316, 319

[56] References Cited

U.S. PATENT DOCUMENTS

| | | | |
|---|---|---|---|
| 3,487,239 | 12/1969 | Shafft | 310/8.5 |
| 3,544,202 | 12/1970 | Fowler | 350/285 |
| 3,569,718 | 3/1971 | Borner | 250/201 |
| 3,902,084 | 8/1975 | May, Jr. | 310/8.1 |
| 4,019,073 | 4/1977 | Vishnevsky et al. | 310/8.2 |
| 4,087,715 | 5/1978 | Myer | 310/317 |
| 4,202,605 | 5/1980 | Heinz | 350/292 |
| 4,400,641 | 8/1983 | Vishnevsky et al. | 310/323 |
| 4,422,002 | 12/1983 | Binning et al. | 310/328 |
| 4,453,103 | 6/1984 | Vishnevsky et al. | 310/323 |
| 4,468,583 | 8/1984 | Mori | 310/328 |
| 4,523,120 | 6/1985 | Assard et al. | 310/323 |
| 4,622,483 | 11/1986 | Staufenberg, Jr. et al. | 310/328 |
| 4,727,278 | 2/1988 | Staufenberg, Jr. et al. | 310/328 |
| 4,736,132 | 4/1988 | Culp | 310/333 |
| 4,775,815 | 10/1988 | Heinz | 310/328 |
| 4,785,177 | 11/1988 | Besocke | 250/442.1 |
| 4,798,989 | 1/1989 | Miyazaki et al. | 310/328 |
| 4,812,698 | 3/1989 | Chida et al. | 310/328 X |
| 4,868,447 | 9/1989 | Lee et al. | 310/366 X |
| 4,871,938 | 10/1989 | Elings et al. | 310/328 |

FOREIGN PATENT DOCUMENTS

| | | |
|---|---|---|
| 6327894 | 11/1988 | Japan . |
| 483061 | 4/1973 | U.S.S.R. . |
| 573828 | 6/1976 | U.S.S.R. . |
| 604058 | 12/1976 | U.S.S.R. . |
| 646395 | 1/1978 | U.S.S.R. . |
| 2205680 | 12/1988 | United Kingdom . |

OTHER PUBLICATIONS

Uozumi et al and English language Article (AR) Novel Three–Dimensional Positioner and Scanner for the STM Using Shear Deformation of Piezoceramic Plates

*Primary Examiner*—Mark O. Budd
*Attorney, Agent, or Firm*—James P. O'Shaughnessey; John J. Deinken

[57] ABSTRACT

A piezoelectric device or actuator (30) includes dimorph stack (32) attached to a support (34). Affixed to the apex of stack (32) is friction surface (36) which is held in contact with the external friction surface of a positionable object (38).

9 Claims, 7 Drawing Sheets

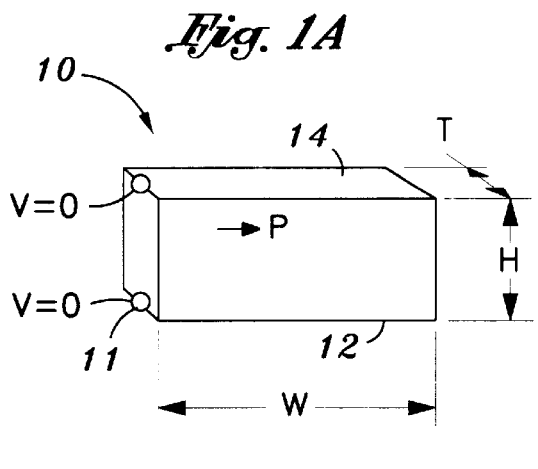
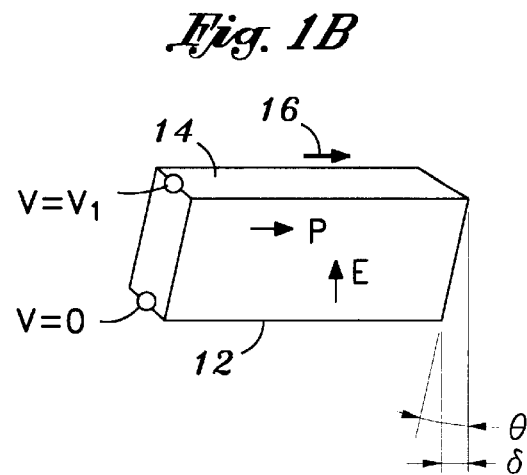
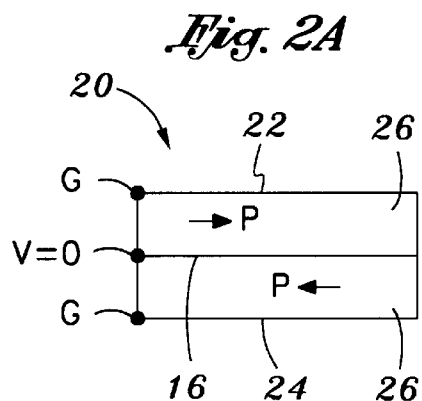
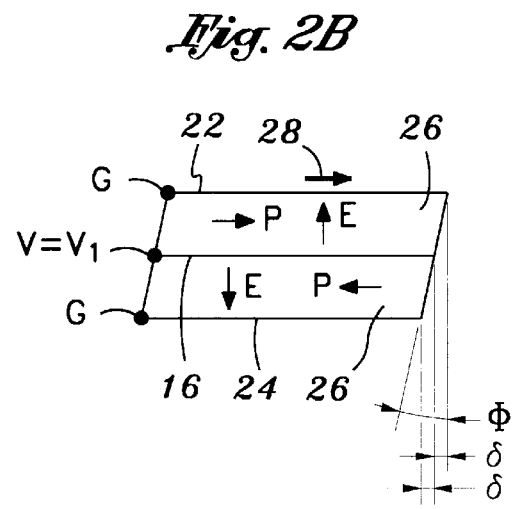
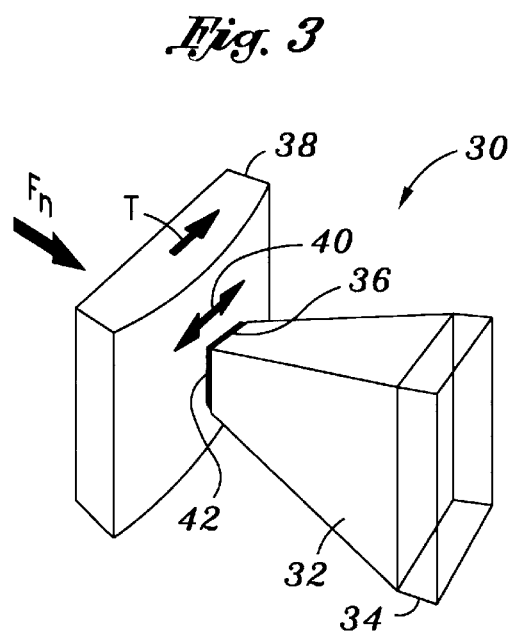
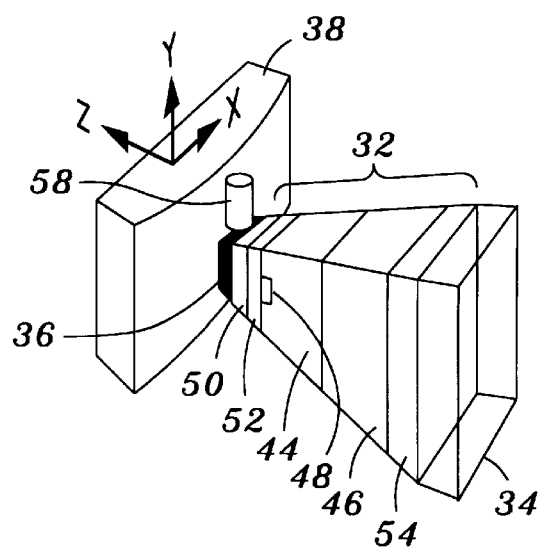

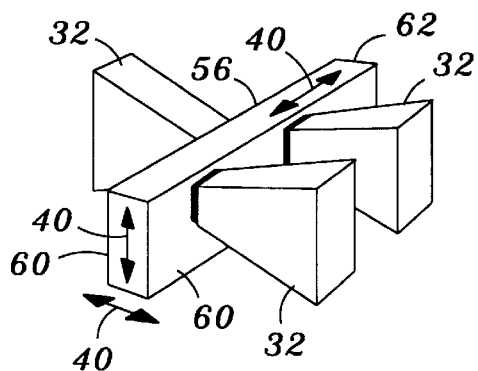
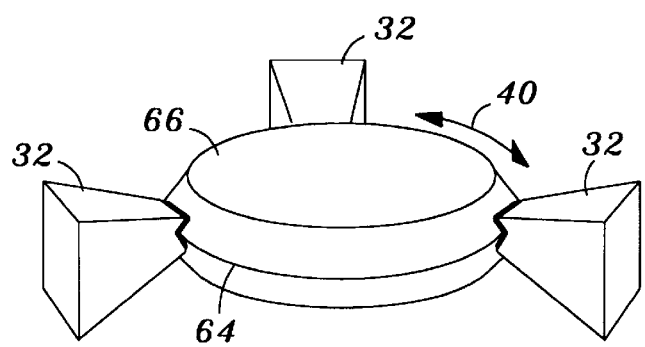
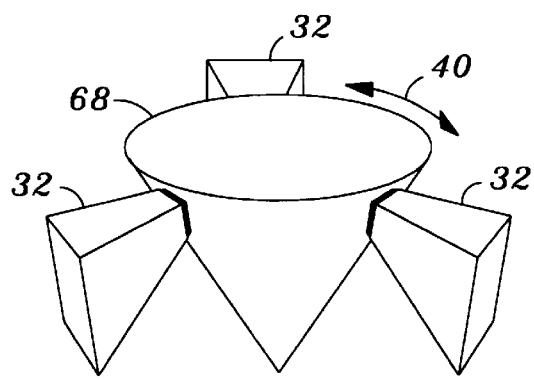
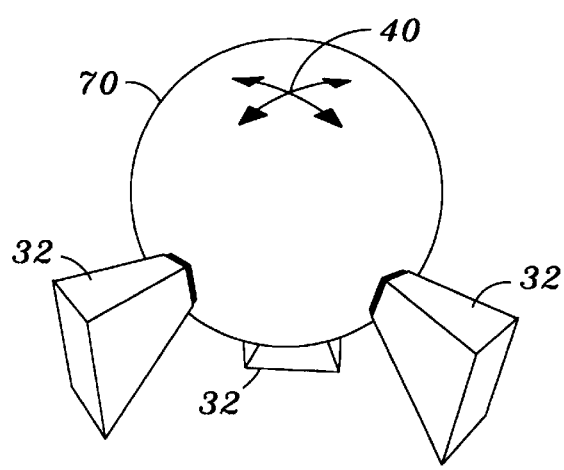

PIEZOELECTRIC ACTUATOR

This is a continuation of application Ser. No. 07/414,176 filed on Sep. 28, 1989 now abandoned which is a division of application Ser. No. 07/252,197 Sep. 30, 1988, now U.S. Pat. No. 4,928,030.

BACKGROUND OF THE INVENTION

1. Field of the Invention

This invention relates to a controllable piezoelectric shear actuating device and more specifically to a device which effects motion in an object through the imposition of traction and release forces thereon.

2. Background Art

A few devices incorporating piezoelectric assemblies for actuation of same are known. *Rev. Sci. Instrum.* 58 (1), January 1987, details a dynamic piezoelectric translation device whose motion is caused by a sawtoothlike periodic acceleration of a piezoelectric element and the inertia of the translation stage.

Another device incorporating a piezoelectric linear actuator known as the Inchworm™ (U.S. Pat. Nos. 3,902,084 and 3,902,085) describe an assembly of extension mode piezoelectric tubular elements wherein alternate gripping and releasing of a coaxial rod by end tubes and timely stretching and shrinking of a center tube effect translation of the rod. More specifically, the Inchworm (Trademark of Burleigh Instruments, Inc., New York) achieves positioning by cyclically releasing, extending, gripping, releasing, contracting, and gripping a rod-like object. The rod-like object is moved along one axis. The use of one extending and two gripping portions does not permit motion of the rod-like object with constant velocity. The thickness piezoelectric deformation is used in the gripping portions. The extensional piezoelectric deformation is used in the extension and contracting portion. During the releasing portions of a cycle the gripping normal force is reduced to zero. Cyclical gripping and releasing causes cyclical conversion of stored elastic potential energy into kinetic energy and the converse. The cyclic energy conversion acoustically and dynamically excites the rod-like object, the piezoelectric actuators, and all structures adjunct thereto. The position of the rod-like object changes with changing temperature. Rubbing of the rod-like object occurs at the beginning and at the end of each gripping and releasing portion of the cycle except when the rod-like object has zero velocity. The efficiency of the conversion of electrical to mechanical energy is limited by rubbing. The useful life of the surface portions of the Inchworm which are in contact with the rod-like object is limited by rubbing. The extension portion of the Inchworm is subjected to tensile stresses during the contracting portion of each cycle. The tensile stresses bound the range of the combination of moving mass, contracting force, and cycling frequency. The gripping stroke of the thickness deforming piezoelectric portion limits the size of the force acting radially on the rod-like object at which cycling is effective. The last position of the rod-like object attained by the Inchworm is lost when electrical charge is removed from the piezoelectric portions because the rod-like object is not restrained. During normal operation the Inchworm cannot deter rotation of the rod-like object about its axis.

In patent application Ser. No. 610,461 filed May 15, 1984, the motional portion of a motor linearly translates in one direction. The motional portion is affixed to a movable object by a mechanical linkage. The range of the translation of the movable object is not greater than the range of the translation of the motional portion derived from piezoelecric stroke in combination with any leverage of the mechanical linkage. The piezoelectric stroke is increased by increasing the height of the layered actuator body portion. Increasing the height of the body portion increases the electrical capacitance. Increasing the capacitance decreases translation speed at a given force and range of stroke, and decreases the force with a given speed and range of stroke, all other elements being constant. The height of the piezoelectric body changes as the temperature of the body changes. During translation the piezoelectric body is subjected to tension stresses due to bending and shear stresses due to forces applied to or discovered at the motional portion, said stresses imposing a limit on the combination of speed, stroke and force. The broad surfaces of piezoelectric layers are electrically insulated each from the others. Since the cross section of the piezoelectric body is constant between the motional portion and the mounting base, the mass near the motional portion is also translated; the inertial reaction force of said mass adds to the force applied by the movable object and the adjunct mechanical linkage, thereby bounding the range of the combination of speed, stroke and force.

These piezoelectric actuators are readily distinguished from the present invention in that, for example, in the first instance to create a translational motion, a sawtooth electrical wave form must be applied to a piezo tube in order to overcome the static friction limit within the device thereby evidencing the principle of inertial sliding of a platform. With the Inchworm assembly the translation is intermittent due to grip, release, and the gripping force is unloaded twice for every step.

As described in more detail below, the piezoelectric shear device or actuator of the present invention provides for a translation which is both smooth and continuous, axial loads maintain piezoelectric compression, and normal force being constant absents vibrational interference which is encountered in the aforementioned piezoelectric devices.

OBJECTS OF THE INVENTION

An object of the invention is to provide a piezoelectric shear device with wide application as a precision positioner and actuator.

Another object is to utilize the piezoelectric device to energize or create motion in an object through the combined effects of traction and release provided by the piezoelectric device.

A further object is to provide a piezoelectric device whereby the piezoelectric device not only acts as the motive force but also substitutes for known mechanical components of devices such as bearings, linkages, support structures, and the like.

Other objects, advantages, and novel features of the present invention will become apparent from the following detailed description of the invention when considered in conjunction with the accompanying drawings.

SUMMARY OF THE INVENTION

The objects and advantages of the present invention are attained by a piezoelectric shear device for providing motive forces to mechanical assemblies such as a disk, driving axle and the like.

The piezoelectric shear device consists of at least one piezoelectric element. The crown or tip of the element is a friction surface and an opposite surface is supported by a support structure.

The piezoelectric device also includes control means such as those necessary for sensing, positioning, and activating the piezoelectric shear device so as to transfer a motive force for initiating the movement of an object.

BRIEF DESCRIPTION OF THE DRAWINGS

FIG. 1A depicts a quiescent piezoelectric element with respect to polarization, electrodes, and dimensions.

FIG. 1B depicts the piezoelectric element of FIG. 1A with respect to an applied electric potential, to the resultant electric field therein, and to the shear angular deformation and stroke.

FIG. 2A shows a cross section of the quiescent state of a dimorph which when functionally combined according to the present invention constitute composite co-functional piezoelectric elements of a piezoelectric device.

FIG. 2B shows the dimorph of FIG. 1A with respect to electrodes, applied electrical potential, the resultant electric fields, and the dispositions of shear deformations and strokes.

FIG. 3 indicates a dimorphic actuator with respect to positioning an object.

FIG. 4 illustrates an actuator including sensor portions with respect to positioning an object.

FIG. 8 illustrates the positioning of a rod-like object by a group of piezoelectric shear actuators.

FIG. 9 shows the positioning of a disk-like object by a group of piezoelectric actuators.

FIG. 10 depicts the positioning of a cone-like object by a group of piezoelectric actuators.

FIG. 11 illustrates the positioning of a spherical object by a group of piezoelectric actuators.

DETAILED DESCRIPTION OF THE INVENTION

Figure 5A:
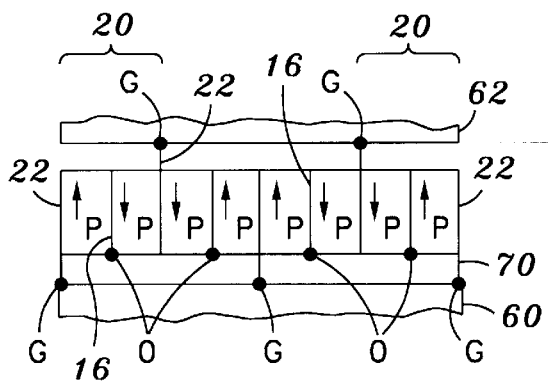
FIG. 5A shows the cross section of the quiescent state of a lifter dimorph assembly with respect to polarization, electrodes, and electrical connections.

Referring to the drawings and particularly to FIG. 1A and FIG. 1B, there is disclosed a block 10 of piezoelectric material wherein the direction of polarization P lies parallel to the plane of electrically conductive electrodes 12, 14, wherein electrode 12 is maintained at zero potential (ground) and the application of a positive electric potential V1 on electrode 14 creates an electric field E lying perpendicular to P whereupon all cutting planes parallel to field E and perpendicular to P undergo a positive angular deformation $\theta$ (shear) about an axis which is normal to the plane containing the vectors P and E, while the application of the opposite electric potential causes shear in the opposite sense.

The shear angle is given by $\theta=d_{15}E$ where $d_{15}$ is the piezoelectric shear coefficient and is independent of geometry. The electric field is related to geometry by $E=V_1/H$ where H is the height of block 10.

A more useful description of shear deformation results when electrode 12 is considered to remain stationary while the application of a positive potential $V_1$ to electrode 14 causes the surface of electrode 14 to translate parallel to 12 in the direction indicated by arrow 16 by a stroke $\delta$ approximately given by $\theta H$. Bipolar values of $V_1$ allow $2\delta$ of stroke. The shear stroke $\delta$ will be of great interest throughout this disclosure.

Values of $d_{15}$ are typically 300 to 700 pm/volt but values 10 to 20 times higher are possible. Current practice uses values of $\theta$ up to 2 mradians, whereas 50 mradians is possible. Shear coefficients are usually higher than all other polarization modes in a given piezoelectric specimen, thereby giving the greatest deformation.

The dimensions H, W and T remain constant regardless of the state of shear deformation. The state of piezoelectric polarization remains unchanged in ferroelectric materials when $V_1$ is bipolar, whereas all other modes of polarization where useful values of E are antiparallel to P result in reduction, destruction, or even reversal of P in ferroelectric materials. Therefore bipolar electric drive provides twice the usable deformation than monopolar-limited polarization, in addition to the increase due to the larger shear coefficient.

FIG. 2A and FIG. 2B depict the building block, also called a dimorph, of the present invention. The arrangement of FIG. 2A shows in cross section piezoelectric shear body 20 wherein a center electrode 16 may be supplied with electric potential V such that electric fields E are created in piezoelectric portions 26 relative to electrodes 22 and 24. The polarization vectors P are antiparallel on either side of electrode 16 so that the shear deformation angles $\phi$ occur in the same sense while shear deformations $\delta$ are additive.

The dimorph requires one half of the electrical potential for a given geometry and electric field because of the center electrode in combination with the antiparallel polarizations, than the case where no center electrode was used.

The electrodes 22 and 24 remain at ground potential in order to join two or more dimorphs at their ground electrodes without regard to the potential state therebetween and without regard to the potential state of another joining member to which the dimorphs may be attached.

Dimorphs joined by ground electrodes require only a single conducting plane between pairs of dimorphs. Electrical insulation is not needed between dimorphs. Dimorphs may be fusion bonded and may be fabricated as multilayer monolithic structures depending upon the type of fabrication process selected.

The deformation angle $\phi$ will be the same as $\theta$ of FIG. 1B when the electric field and the piezoelectric material are congruent. When electrode 24 remains stationary, electrode 22 translates in the direction of arrow 28 by a stroke of $2\delta$. The stroke from a stack of n dimorphs (where n is at least 2) provides a stroke of $\pm 2n\delta$ when the applied potential is bipolar.

FIG. 3 shows a characteristic piezoelectric shear actuator generally indicated as 30 comprising dimorph stack 32 attached to support means 34. Affixed to the apex of stack 32 is friction surface portion 36, hereinafter referred to as the crown, which is held in contact with the external friction surface portion of a positionable object 38 by externally applied normal force $F_n$. Application of electric potentials via conductors (not shown) to dimorph stack 32 causes crown 36 to translate in the directions indicated by arrow 40. Non-sliding friction at contact surface 42 translates object 38 by a distance parallel to T which is proportional to the change of electric potential applied to the stack. The actuator translates the object with a distance range commensurate with the stroke of the actuator corresponding to the range of the bipolar applied electric potential. At the extreme of the actuator stroke, the direction of object positioning may be reversed while non-sliding contact obtains, and alternatively, further translation is caused by initiating a retrace.

A retrace is a transition from sliding to non-sliding contact at contact surface 42 initiated by the reversal of the applied electric potential and a corresponding reversal of the direction of translation by crown portion 36 that is sufficiently sudden that the state of motion of the positioned object 38 persists essentially unaltered in direction T throughout the retrace. Contact 42 is moved to anywhere within the stroke range of the actuator by rapid acceleration of crown 36 to maximum velocity and rapid deceleration to a stop at the new location where sliding ceases and non-sliding resumes. The normal force $F_n$ may remain constant throughout the retrace. Retracing will be discussed in more detail subsequently.

FIG. 4 shows the actuator of FIG. 3 with coordinates X, Y, and Z defined as fixed to support means 34. Actuator body 32 comprises crown 36, X piezoelectric shear sensor portion 50, Y piezoelectric shear sensor portion 52, normal force piezoelectric sensing portion 48, X and Y translation shear piezoelectric portions 44 and 46, and Z translation shear piezoelectric or compression transduction portion 54, the latter hereinafter being referred to as a lifter. Non-contacting Y position sensor 58 creates an electric signal related to the position, velocity, and acceleration of crown 36 relative to support means 34 (the X non-contacting position sensor is omitted for clarity). From the description of FIG. 3 it should be clear that crown 36 is translatable in three mutually orthongonal directions. The sensor portions will be discussed subsequent to lifters. Retrace is appropriate only in the X and Y directions.

A stroke of lifter 54 changes the normal force $F_n$. The lifter may establish the normal force if the lifter stroke is larger than the stroke that would be required to compress the actuator by an amount due to the maximum normal force. The lifter maintains the normal force at a desired value despite differential thermal expansion of the apparatus. Translation in the Z direction, in combination with additional actuators acting on the same object, but at different contact locations, may reposition the object.

A pyramidal actuator form with the crown at the apex reduces the mass accelerated and decelerated by the actuator, which in turn shortens the time for the actuator to perform a retrace.

Figure 5B:
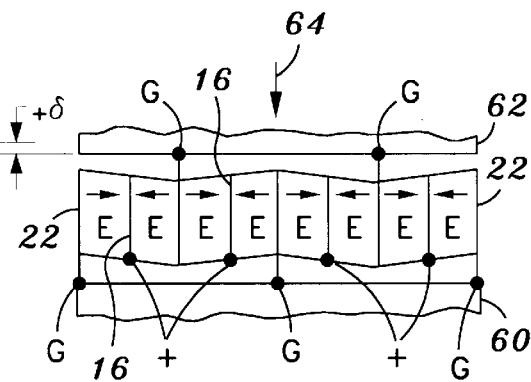
FIG. 5B shows the assembly of FIG. 5A with a positive electrical potential applied with respect to translation.
Figure 5C:
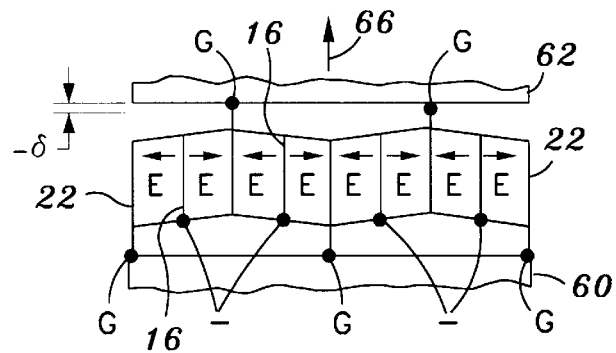
FIG. 5C shows the assembly of FIG. 5B with respect to a negative applied potential.

FIG. 5A shows a cross section of the preferred embodiment of the Z translation piezoelectric portion 54, or lifter, in the quiescent state. The lifter comprises two or more dimorphs 20 with grounded electrodes 22 and active electrodes 16 lying parallel to the desired direction of lifter translation. The directions of piezoelectric shear polarizations are indicated by arrows P. Ground electrodes 22 are alternately extended external to the dimorph body and affixed to the actuator portions 60 and 62 on each side of the lifter. Application of a positive electric potential to electrodes 16 creates electric field E in the directions indicated by arrows E which causes portion 62 to translate in the direction indicated by arrow 64 (see FIG. 5B) by a distance +δ relative to adjacent structure 60. The positive sign indicates a convention in which translations normal to the retrace plane are taken in the positive sense when the stack is compressed. For clarity, a −δ translation follows the application of a negative potential as shown in FIG. 5C while portion 62 translates in direction of arrow 66.

The distance electrodes 22 extend exterior to the dimorph body is sufficient for electrical insulation between the edges of active electrodes 16 and adjacent structures 60 and 62. Doubling the number of dimorphs between an adjacent pair of electrodes 22 will double the stroke at the same applied electric potential, and alternatively, will halve the applied potential for the same applied electric field intensity. The lifter stroke δ is independent of the size of the dimorph measured in the direction of the translation. The size may be made as small as desired commensurate with the limits imposed by the shear strength of the piezoelectric material and the applied and residual shear stresses.

The shear lifter has a quiescent position equal to half of the full bipolar stroke. The quiescent normal force and quiescent stroke are each half of the maximum operating values. The quiescent half normal force may retain the position of the movable object when power is off. Similarly, the initial configuration of the apparatus limits the quiescent state of internal stress to a value less than that which would otherwise obtain when the maximum positive (stack compressing) lifter stroke is invoked.

Figure 6A:
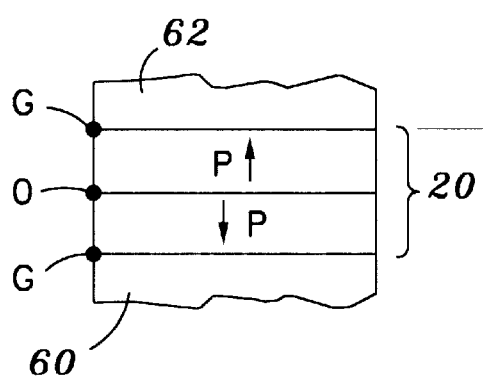
FIG. 6A depicts the cross section of the quiescent state of a lifter dimorph with respect to polarization in the thickness direction.
Figure 6B:
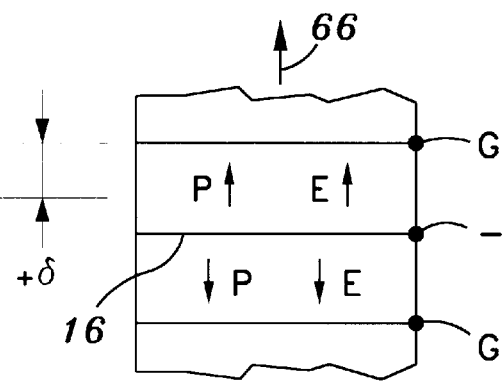
FIG. 6B illustrates the lifter of FIG. 6A with respect to the application of a negative electrical potential and stroke.

FIG. 6A shows the cross section of a quiescent thickness deformation lifter in which dimorphs 20 are polarized in the directions P. The lifter is affixed to adjacent actuator structures 60 and 62. As shown in FIG. 6B, the application of a negative potential to electrodes 16 causes a lift in the direction indicated by arrow 66, the lift stroke being +δ. For the reasons previously described, the applied potential is limited to a single polarity such that the electric field is never antiparallel to the direction of polarization P. Because the piezoelectric thickness coefficient $d_{33}$ is smaller than the shear coefficient $d_{15}$, a thickness stroke smaller than the shear stroke is expected, given equivalent geometry and electric field intensity. The quiescent thickness of this lifter is less than when full potential is applied. The thickness lifter releases the movable object when the power is off when the maximum lifter stroke is greater than the compressive deflection of the actuator in the apparatus due to a compressive preload.

Figure 7A:
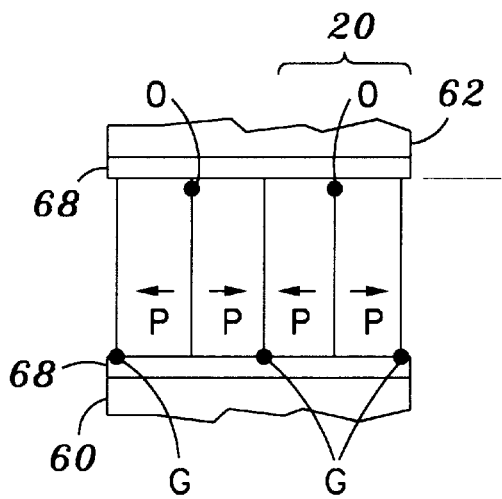
FIG. 7A shows the cross section of the quiescent state of an extension lifter with respect to polarization and electrodes.
Figure 7B:
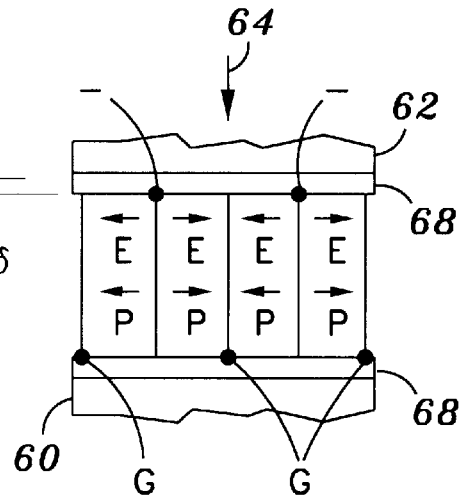
FIG. 7B depicts the lifter of FIG. 7A with respect to a negative applied electrical potential and stroke.

FIG. 7A shows a cross section of a quiescent lifter composed of extension deformation piezoelectric dimorphs 20 electrically isolated from adjacent actuator portions 60 and 62 by insulators 68. As shown in FIG. 7B, application of a negative potential to active electrodes causes extension stroke −δ with translation of portion 62 relative to portion 60 in the direction indicated by arrow 64. This lifter remains in the state of maximum stack compression when power is off, thereby maintaining position control of the movable object in the quiescent lifter state. Applied electric potential is restricted to monopolar as in the thickness lifter. Given a similar geometry and applied electric field, the extension lifter is expected to have a smaller stroke than the thickness and shear lifters because the extension piezoelectric coefficient $d_{31}$ has the smallest value of the three coefficients.

Shear, thickness, and extension deformation lifters may be used in any combination within the same actuator to adjust the stroke magnitude, stroke direction, and the quiescent state of stroke and applied normal force as appropriate to a desired use of an actuator.

The position of the lifter portion in the body of the actuator is unimportant except when the lifter must translate a portion of the actuator body with large acceleration, this being most advantageously achieved by positioning the lifter in the actuator at a location which minimizes the mass of actuator material which must be accelerated.

Referring to FIG. 8, shown is an embodiment in which actuators 32 act on the external surfaces 60 of bar-like object 62 which is to be positioned. A supporting means is not shown for clarity. The bar-like object, for example, may be a mechanism subassembly requiring positioning about zero to three axes by rotation (not indicated) and translation parallel to zero to three mutually perpendicular directions indicated by arrows 40. Such positionings are caused by three or more actuators acting in concert. With and without external guides (not shown) the bar-like object is positionally controlled at all times when each actuator 32 retraces at a separate time. As previously described, each retrace requires less time than that required for the bar-like object to move a significant distance due to an externally acting force such as gravity and due to the retrograde retrace friction force. The retrograde retrace friction force is resisted by the inertia of the bar-like object as well as the friction of the actuators not retracing.

Referring to FIG. 9, shown is an embodiment in which three or more actuators 32 act on the external beveled surfaces 64 of disk-like object 66 which is to be positioned. A supporting means is not shown for clarity. The disk, for example may be a mechanism subassembly requiring positioning about zero to three axes by rotation, and requiring translations parallel to zero to three mutually perpendicular directions, but is primarily intended for unlimited rotation about one axis indicated by arrows 40. The contact between the crown and the disk edge is a double line contact. The crowns provide all of the supporting and positioning functions for the disk, other bearings or guides not being needed. A lifter in one actuator may adjust for differential thermal expansion. A lifter portion in all actuators act in concert to position the disk parallel to its broadest plane. The lifter portions allow the alteration of the radial force applied to the disk to achieve a desired deformation, and to affect a correction of an unwanted deformation by the application of a deformation in the opposite sense and in the appropriate locations on the disk edge, the latter commonly referred to in optical teachings as a modal mirror or modal lens. When the disk is an optical grating, the actuators without retraces affect a dynamic, that is, at frequencies of hundreds of Hertz, positioning of the grating in two angles and axially, while with retraces at low frequencies and for static alignment the actuators rotate the grating in directions 40, commonly referred to as clocking.

Referring to FIG. 10, shown is an embodiment in which shear actuators 32 act on the external surface of cone 68 which is to be positioned. A supporting means for the piezoelectric actuators is not shown for clarity. The cone, for example, may be a mechanism subassembly requiring positioning about zero to three axes by rotation and translation parallel to zero to three mutually perpendicular directions, but primarily in rotation about one axis, said motion indicated by arrow 40. Such positionings are accomplished by the combination of actuators, each actuator providing zero to three translations caused by piezoelectric shear deformations. The contact between the crown and the conical surface is a line contact but may be Hertzian. The crowns provide all of the supporting and positioning functions for the cone when a force such as gravity acts downward on the figure. Other bearings or guides are not needed. Both lifter and tangenter piezoelectric portions in each actuator adjust the axial position of the cone. Tengenter piezoelectric portions acting tangential to the conical surface affect the rotation of the cone. Within the limits imposed by the shape of the frictional contact of the crowns with the conical surface, rotations of the cone are provided about axes perpendicular to the axis of symmetry of the cone.

Referring to FIG. 11, shown is an embodiment in which three or more shear actuators 32 act on the external surface of sphere 70 which is to be positioned. A supporting means for the piezoelectric actuators is not shown for clarity. The sphere, for example, may be a mechanism subassembly requiring positioning about zero to three axes by rotation and translation parallel to zero to three mutually perpendicular directions, but primarily in rotation about three axes, said motions, being unbounded, are indicated by arrows 40. Such positionings are accomplished by the combination of actuators, each actuator providing zero to three translations caused by piezoelectric shear deformations. The contact between the crowns and the spherical surface is Hertzian, that is, a small circle or ellipse. The crowns provide all of the supporting and positioning functions for the sphere when a force such as gravity acts downward in the figure. A fourth actuator at the apex of a tetrahedron imagined (not shown) in the figure confines the sphere in the absence of external forces and restraints. Other bearings or guides are not needed. Lifter piezoelectric portions in each actuator adjust the normal force on the sphere. Tengenter piezoelectric portions affect the rotation of the sphere about three perpendicular axes. Small translations along three mutually perpendicular axes are affected by combinations of lifter and tangenter piezoelectric motions of the actuators.

Figure 12:
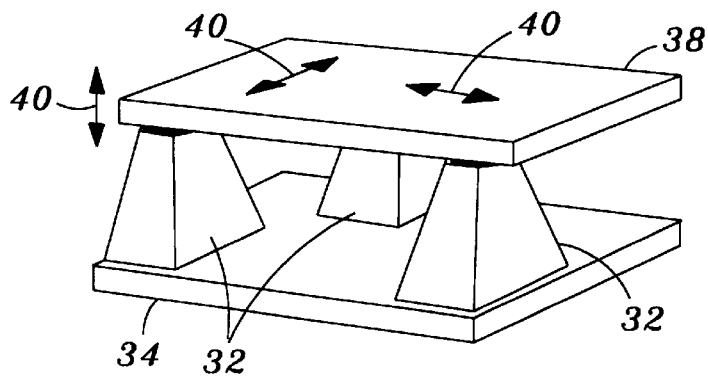
FIG. 12 shows the positioning of a slab-like object by three piezoelectric actuators.

Referring to FIG. 12, shown is an embodiment in which three actuators 32 act on the plane under surface of slab-like object 38 which is to be positioned in directions indicated by arrows 40 relative to support means 34, but primarily in the plane of the slab for which positionings are limited only by the extent of the surface of the slab and the footprint of the actuator contacts. The slab is also rotatable about any axis normal to the broad surface of the slab, again the positioning being limited only by the extent of the broad surface of the slab. This embodiment also operates without gravity and without external normal forcing means when one or more actuators are added to and act on the upper surface of the slab of the figure. In combination with slab position detecting means (not shown) the apparatus is applicable to integrated circuit mask alignment, to optical microscope sample positioning, and to the positioning of samples in a tunnelling electron microscope.

The lifter portions of the actuators acting in unison translate the slab in a direction normal to its broad surface in a range equal to the strokes of the lifters. When acting with suitably different potentials, the lifters rotate the slab about two perpendicular axes through small angles. In short, all six degrees of positioning freedom are provided, three of which are large.

The embodiment of FIG. 12 may be inverted, that is, support means 34 in unit with actuators 32 may be positioned while slab 38 remains stationary.

Figure 13:
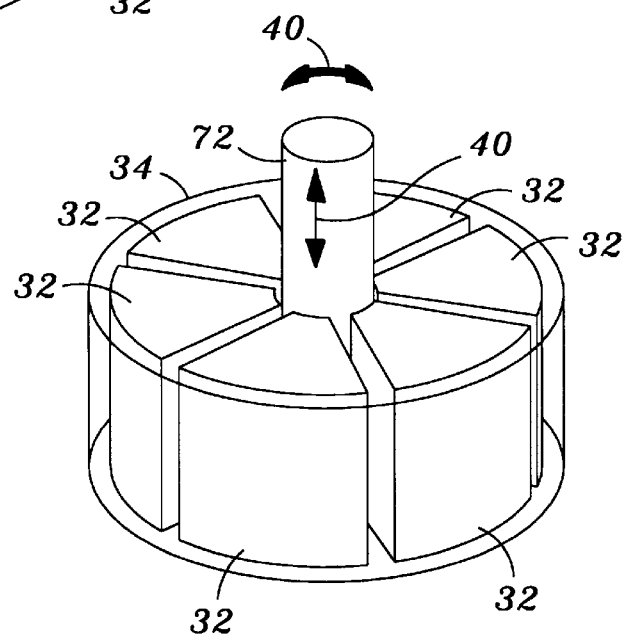
FIG. 13 illustrates an electric motor with respect to piezoelectric actuators and shaft positioning.

Referring to FIG. 13, shown is an embodiment in which an even number of piezoelectric actuators 32 are affixed to support means 34, grip and position shaft 72. Symmetry of forces applied to the shaft result when diametrically opposite actuators are operated and retraced as a pair. The fewest number of electric charge sources is needed, namely two, for each actuator stroke direction, when actuators are electrically connected into two groups, for example, evens and odds.

The shaft 72 is rolled between opposite actuator crowns when tangential actuator motions occur, as one would roll a pencil between flattened palms, as indicated by the curved arrow 40. Alternating synchronized retraces of actuator groups affect smooth shaft positioning. Axial actuator crown motions cause the shaft to translate axially as indicated by the straight arrow 40. Lifter portions control normal force on the shaft and compensate for differential thermal expansion. Lifters may also align the axis of the shaft as desired, or may cause the shaft axis to trace an arbitrarily shaped closed curve during shaft rotation to compensate for an out-of-balance condition, for example, in perturbed rotating machinery. Crowns may be hydrostatic and hydrodynamic fluid bearings which have the fluid film thickness controlled at high frequencies by the lifters.

Figure 14:
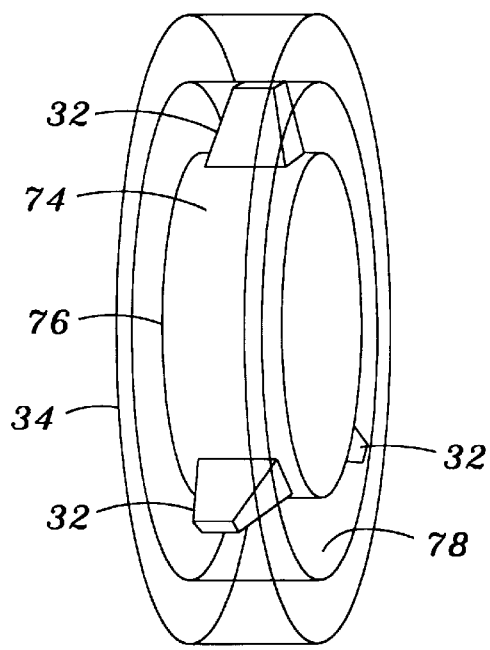
FIG. 14 shows the positioning of an object to which is attached piezoelectric actuators.

Referring to FIG. 14, shown is yet another embodiment in which piezoelectric actuators 32 are affixed to the external surfaces 74 of the object 76 to be positioned and actuator crowns bear on and move around the full extent of friction surface 78 of support means 34. The positioned object, for example, may be an optical element which requires positioning about zero to three axes by rotation and by translation parallel to zero to three mutually perpendicular directions. Such positionings are accomplished by the actuators operating in concert. Motion by retrace adjusts axial position when object 76 is an optical element, in which optical figure remains unaltered with respect to positioning because the location of loads and moments remain unaltered with respect to positioning.

Smooth positioning of the object obtains as described with reference to FIGS. 14, 15 and 16. At each actuator location of FIG. 14, each actuator may be replaced by a group of two or more actuators, each group acting on nearly the same portion of friction support surface 78 as the former single actuator, in order to apply the method of smooth operation described more fully hereinbelow for FIG. 16. The use of actuator groups may be extended to all of the embodiments herein described to achieve greater structural stiffness, for smoother operation, for greater load bearing capability, and any combination of these benefits.

Figure 15:
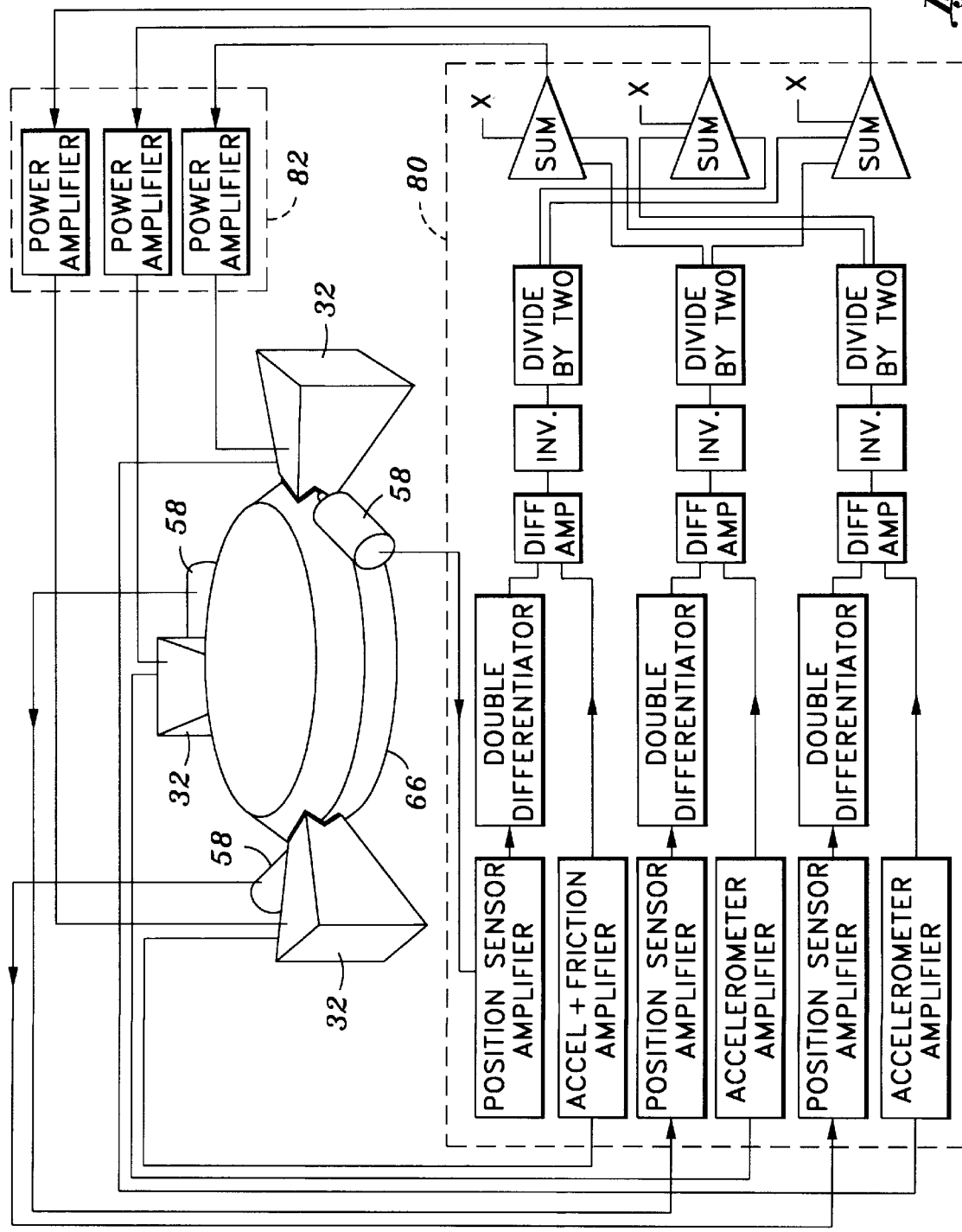
FIG. 15 shows a piezoelectric positioning apparatus employing negative feedback for constant velocity smooth positioning.

Referring to FIG. 15, a schematic diagram of the positioning system appropriate to the embodiment of FIG. 9, shows controlling means 80 and the electric charge source 82 which may be linear power amplifiers. This example illustrates a method of producing unperturbed constant angular velocity positioning of disk 66. Actuators retrace singly. The tangential force transducer 50 of FIG. 4 produces an electric signal which is the sum of the tangential friction force on the crown and the inertial reaction force caused by acceleration of the crown mass and a portion of the mass of the sensing element itself during retrace. The signal from the sensing element is conditioned by the acceleration-friction amplifier. The conditioning comprises compensation for the known masses and elastic properties of the crown and sensor portions.

Near each crown is a non-contacting sensor 58 which produces an electrical signal proportional to the tangential position of the crown relative to the supporting means (not shown). The position signal is conditioned and doubly differentiated to derive a signal proportional to the acceleration of the crown during retrace.

A difference amplifier subtracts the derived acceleration signal from the measured acceleration-friction signal, producing a signal which is proportional solely to the friction force applied to the retracing crown. The friction signal is inverted, divided by two, and summed with the positioning signals X externally applied to the other two actuators which are not undergoing a retrace. The summing networks provide signals to the power amplifiers. Superimposing half of the inverted retrace friction signal to each of the non-retracing actuators adds two positive half increments of torque to the disk to compensate for the one increment of negative torque applied to the disk by the actuator performing the retrace. The three torques, being mutually anticomplementary, add to zero torque, causing the disk to be driven with constant torque despite retraces. The application of half increments of torque to the two non-retracing actuators precludes exceeding the tangential friction force of non-retracing crowns, thereby precluding an unwanted transition from rolling to sliding.

The least perturbed rotation of the disk obtains when the normal force of the three actuators remains constant throughout the cycle. A constant normal force obviates the release and reapplication of stored elastic energy, thereby minimizes the excitation of structural vibrations. Lifters are not needed in this embodiment for adjusting the normal force but may be used to compensate for differential thermal expansion, or to change the normal force to affect a deliberate deformation in the disk, as would be desirable in some optical elements. Rubbing energy dissipation during a retrace is reduced by increasing the crown acceleration. The externally applied positioning signals X are adjusted for longer or shorter piezoelectric shear strokes between retraces. A shorter stroke reduces the magnitude of the disk to crown contact relocation distance position on the crown friction surface, which reduces the change in the moment applied to the crown portion of the actuator by the applied normal force.

When any combination of the aforementioned methods of operating the device are used, disk rotation proceeds with a smoothness and precision appropriate to optical element positioning. The disk may be an optical mirror, a diffraction grating or a lens. When a portion of each tangenter of each actuator acts in the direction of the axis of the disk, appropriate power amplifiers being added, then two directions of rotary positioning and one direction of axial positioning of the optical element are made available.

When the friction surfaces of movable objects are standardized, the same actuators and associated electrical equipments will suffice for the positioning of a large and varied family of objects.

Figure 16:
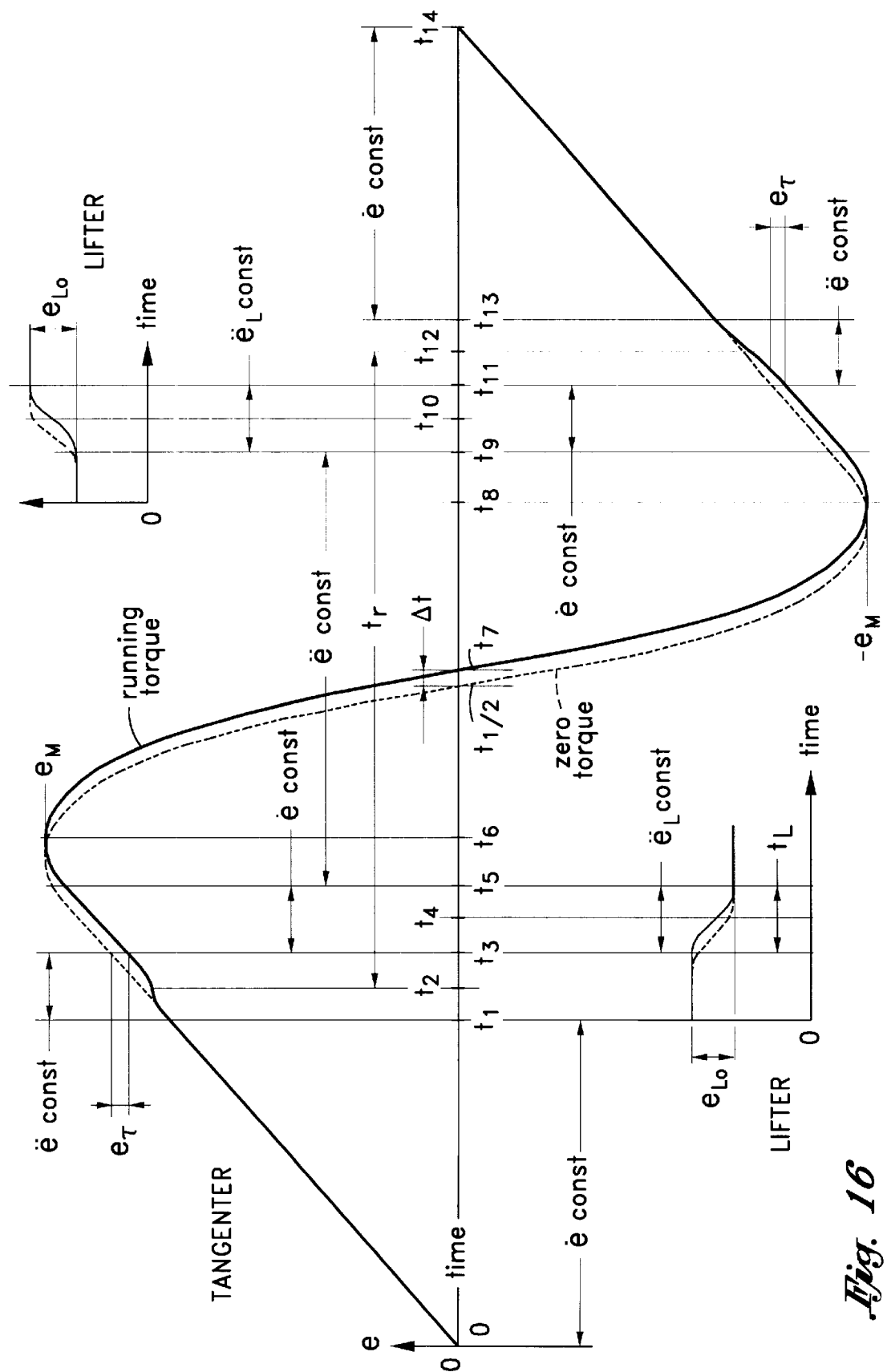
FIG. 16 illustrates the timing of piezoelectric motor actuators for constant velocity smooth positioning of a shaft.

Referring now to FIG. 16, time is plotted as a function of potentials applied to the piezoelectric actuators of the electric motor embodiment shown in FIG. 13. In this example, the actuators are electrically connected into two sets, evens and odds, and are driven alternately by two linear tangenter amplifiers and two lifter linear amplifiers. The tangenter piezoelectric portions are acting tangential to the shaft. The lifter piezoelectric portions are acting normal to the shaft surface. A shaft position sensor (not shown) provides shaft position and shaft angular velocity signals to the controlling means. The tangenter amplifiers each provide a maximum potential of $\pm e_M$, while the lifter amplifiers each provide a potential change of $e_{L_o}$ to alter the normal force between the crowns and the shaft, and the potential change floats to compensate for differential thermal expansion in the motor. The potential from the tangenter amplifier has a slew rate of $\dot{e}$ and a potential acceleration of $\ddot{e}$. The lifter amplifier supplies a slew rate of $\dot{e}_L$ and a potential acceleration of $\ddot{e}_L$. Even actuators apply torque to the shaft alternately with odd actuators. Even actuators, as in the time plot of FIG. 16, grip the shaft at the beginning of the cycle and, using the constant slew rate of the tangenter amplifier, rotate the shaft with constant speed from time zero to $t_1$. The even actuators are gripping and rotating the shaft with constant speed from $t_{13}$ to $t_{14}$. The central $t_r$ part of the plot is the retrace portion of the cycle.

Both sets of actuators, acting alternately, apply constant torque to the shaft when the retrace time $t_r$ is half the cycle time $t_{14}$, and the timing of the even-numbered actuators differs in phase from the odd-numbered actuators by half the cycle time, namely, $t_{1/2}$, so that torque is begun to be applied to the shaft by the even actuators as torque is removed from the shaft by the odd actuators. The constant slew rate of the tangenter portion causes the crown to follow the shaft surface with no relative motion. Simply tracking the shaft surface with the crown does not apply torque to the shaft but does avoid rubbing when desired.

To apply torque to the shaft, a torque potential $e_\tau$ is added to the tangenter potential. Changes in torquing potential are made with constant voltage acceleration $\ddot{e}$ and with constant voltage deceleration $-\ddot{e}$. As previously discussed, the potential $e_\tau$ is limited by the product of the normal force and the coefficient of non-sliding friction between the crown friction surface and the shaft.

Operating efficiency of the device is limited by electrical losses in the actuators, rolling losses, and rubbing losses. Electrical losses and rolling losses are negligible. High efficiency operation obtains when rubbing losses are reduced. High efficiency operation requires that torquing potential $e_\tau$ be removed from the tangenter portion of the actuator between $t_1$ and $t_3$ before retrace commences to eliminate rubbing between the crown and the shaft when contact is broken. Similarly, torquing potential $e_\tau$ is applied between $t_{11}$ and $t_{13}$ after retrace is completed. While torque is applied to the shaft, reduction of the friction force on the shaft to a value less than the applied tangential force would cause an unwanted transition from non-sliding to sliding of the crown contact. The unwanted transition is avoided by superimposing the torque application and removal on the constant speed potential, that is, tracking the shaft to obviate unwanted relative motion.

Retrace proceeds at constant potential acceleration and deceleration. Rubbing during retrace may be reduced by making the average velocity of the crown relative to the shaft as high as possible. The average velocity increases with higher values of voltage acceleration. A higher value of average sliding velocity reduces rubbing because the sliding friction tangential force decreases approximately in proportion to the logarithm of the sliding velocity. Retrace rubbing may be reduced by reducing the normal force $F_n$ by changing the lifter potential by an amount $e_{Lo}$ between times $t_3$ and $t_5$, and by reapplying $e_{Lo}$ between $t_9$ and $t_{11}$. During time intervals of changing normal force the crown follows the shaft with the same surface velocity so that no relative motion between shaft surface and crown occurs to cause rubbing.

Retrace occurs at maximum voltage acceleration $\ddot{e}$ available from the tangenter power amplifier when it is desirable to have the retrace portion of each cycle be as short as possible, thereby producing the highest shaft rotation rate.

When constant torque obtains, as previously described, the useful work done on the shaft during each cycle is the product of the tangential force on the shaft, the distance traveled by a crown between retraces, the cycling frequency, and the number of crowns (half in this example) engaged at any instant. The horsepower of the device is the product divided by 6600 when the cycle time is given in Hz, dimensions are in inches, and force is in pounds. The cycling frequency is the inverse of $t_{14}$. Maximum constant-torque power is extracted from the device when the cycle time is as short as possible. The shortest cycle time is obtained by using the maximum available values for tangenter and lifter amplifier voltage acceleration. A tangenter voltage slew rate $\dot{e}_L$ is a specific value dictated by constant torque operation, and is less than values that would otherwise be available from conventional linear amplifiers.

Higher values of tangenter voltage slew rate result in non-constant torque on the shaft but will produce somewhat greater power. There is a voltage slew rate value which produces maximum non-constant-torque power. Values of slew rate higher than the maximum power, non-constant-torque value produce less power because a smaller fraction of the cycle time is used for torque application. There is a higher value of slew rate which produces no power because the entire cycle is composed of detorque, lifter, and retrace portions.

In this example in which there are two sets of alternately acting actuators, the static torque can be twice the running torque because in the static case all of the actuators may engage the shaft, none are retracing. When the non-sliding coefficient of friction remains constant, the maximum running torque of the motor is independent of shaft speed. The power produced is a linear function of the shaft speed. The shaft speed depends on the cycling frequency, which in turn, as previously described, depends on the slew rates and voltage accelerations of the amplifiers. Motor speed is changed by changing any combination of step frequency, voltage slew rate, and voltage acceleration. Motor speeds may range from one revolution per indefinitely long time period to thousands of revolutions per minute.

The lifter stroke depends on the deflections of the parts of the device in a radial direction relative to the shaft. Power depends linearly on normal force. An increase in normal force causes an increase of actuator and support means deflection, which causes an increase in lifter stroke. An increase in lifter stroke increases the lifting time, which causes an increase in cycle time, which causes a decrease in power. When motor geometry is fixed, an increase in lifter stroke requires a larger lifter, which in turn reduces the size of the tangenter portion, which reduces the size of the tangential strokes at a given maximum operating voltage.

Normal force is limited by the strengths of the materials used in the device. The largest stress occurs in the line contact between the crown and the shaft. In the motor example the crown is assumed to have a plane friction surface while the shaft is a right circular cylinder. A reduction of the contact stress is affected by making the friction surface of the crown a portion of a cylinder the radius of curvature of which is slightly larger than that of the shaft. The lifter piezoelectric portion of the actuator acts in concert with the tangenter portion to generate the more complex crown motion needed during every part of the cycle. A mechanical advantage of the curved crown friction surface obtains in that more shaft rotation results from a unit of crown tangential movement.

The contact stress depends on the shaft diameter. Increasing the diameter decreases the contact stress. Increasing the shaft diameter linearly increases the torque of the device while linearly decreasing the shaft rotation rate. The power remains unchanged, given a constant actuator size. Piezoelectric motors like that of FIG. 13 are better suited to applications requiring low shaft speed but large torque.

Since the shaft is at all times in the grip of at least half of the actuators, and there is zero clearance between the gripping crowns and the shaft, no bearings are needed. Further, there exist no bearings with less clearance and greater stiffness than the bearing function filled by the piezoelectric actuators. Adding conventional bearings would be ineffectual. The crown contact extends the full length of the device. All of the matter of the device from the shaft axis to the external surface of the housing is of the solid state. Solid materials with high elastic moduli are used when low device mechanical compliance is desired. The device is best viewed as a solid object which allows relative motion under electrical control.

As described for FIG. 13, simultaneous rotary and axial shaft motions are easily generated, making this embodiment applicable to robots.

No ferromagnetic materials and no magnetic fields are used in any embodiment of the present invention, allowing safe and effective operation in intense magnetic fields.

While lubricants such as those used in friction-driven industrial variable speed changers are acceptable, piezoelectric actuators need no lubrication and will operate in and not contaminate a high vacuum environment.

The piezoelectric actuator, being composed of piezoelectric elements, operates equally well as a converter of mechanical to electrical energy. For example, when an automobile using the motor embodiment in one or more of its wheels had the brakes applied, most of the automobile's kinetic energy can be restored to the batteries or other source of electric charge rather than dissipating the energy as waste heat as is customary. The solid curve of FIG. 16 will move to the left of the dotted zero-torque curve during regenerative braking.

The timing plot of FIG. 16 shows 50% retrace and 50% torquing for constant torque running. Adding separate tangenter and lifter amplifiers for each actuator allows operation of any n-numbered-actuator motor with only one pair of actuators retracing at any instant. Constant torque running requires that the retrace portion of each cycle occupy 2/nths of the total cycle time. The longer cycle time, given a fixed retrace time, results in slower shaft rotation rate but higher torque.

There are no identifiable life-shortening mechanisms when the piezoelectric motor is designed with appropriately low shaft-crown contact stress, and when motor operation uses appropriate applied potentials and timing. The efficiency of the piezoelectric motor, when run under these conditions, is expected to exceed 99% compared to an equivalent ferromagnetic motor's efficiency of 92%, the difference being attributable to bearing losses and eddy current losses in the latter.

What is claimed and desired to be secured by Letters of Patent of the United States is:

1. A piezoelectric actuator capable of providing independently controllable motion in first and second angularly disposed planes, comprising:
   a first piezoelectric dimorph having a pair of ground electrodes and an active electrode oriented so as to cause an electrical potential across said piezoelectric portion and move said first piezoelectric dimorph in said first plane;
   a second piezoelectric dimorph acting in said second plane angularly with respect to the first plane, and said second piezoelectric dimorph being in direct physical and conductive electrical contact with a ground electrode of said first piezoelectric dimorph; and
   means for independently controlling an electric field in each of said first and said second piezoelectric dimorphs to produce said independent movement in said first and second piezoelectric dimorphs.

2. The piezoelectric actuator of claim 1 wherein first and second piezoelectric dimorphs act in orthogonally disposed planes.

3. The piezoelectric actuator of claim 1 wherein one piezoelectric dimorph is a lifter acting in thickness mode and the other piezoelectric dimorph acts in a shear mode.

4. The piezoelectric actuator of claim 1 wherein said first piezoelectric dimorph comprises a plurality of first piezoelectric dimorphs each in direct conductive electrical contact with the adjacent dimorph and all providing motion in the same planar direction.

5. The piezoelectric actuator of claim 4 wherein said second piezoelectric dimorph comprises a plurality of second piezoelectric dimorphs each in direct conductive electrical contact with the adjacent dimorph and all providing motion in the same planar direction.

6. A piezoelectric actuator capable of providing independently controllable motion in two angularly disposed planes of motion, which comprises:
   a first ground electrode layer;
   a first piezoelectric wafer, layered onto and in conductive electrical contact with said first ground electrode layer;
   a first active electrode, layered onto and in conductive electrical contact with said first piezoelectric wafer;
   a second piezoelectric wafer, layered onto and in conductive electrical contact with said first active electrode, and wherein said second piezoelectric wafer is orientated so as to act antiparallel to said first piezoelectric wafer;
   second ground electrode, layered onto and in conductive electrical contact with said second piezoelectric wafer;
   a third piezoelectric wafer, layered onto and in conductive electrical contact with said second ground electrode, and wherein said third piezoelectric wafer acts angularly with respect to said first and second piezoelectric wafers;
   a second active electrode, layered onto and in conductive electrical contact with said third piezoelectric wafer;
   a fourth piezoelectric wafer, layered onto and in conductive electrical contact with said second active electrode, and wherein said fourth piezoelectric wafer is oriented so as to act antiparallel to said third piezoelectric wafer;
   a third ground electrode, layered onto and in conductive electrical contact with said fourth piezoelectric wafer; and
   means for independently controlling the electrical potential applied to said first and second active electrodes.

7. A piezoelectric actuator capable of providing independently controllable motion in first and second angularly disposed planes, comprising:
   a first piezoelectric dimorph having first and second piezoelectric wafers positioned adjacent one another, first and second ground electrodes positioned on opposite outer surfaces of said first and second piezoelectric wafers, and a first active electrode extending between said first and second piezoelectric wafers, said first piezoelectric dimorph being oriented so as to produce motion in said first plane in response to an electrical potential applied across said first active electrode and said first and second ground electrodes;

a second piezoelectric dimorph having third and fourth piezoelectric wafers positioned adjacent one another, a third ground electrode positioned on an outer surface of said fourth piezoelectric wafer, and a second active electrode extending between said third and fourth piezoelectric wafers, the outer surface of said third piezoelectric wafer being positioned in direct physical and electrical contact with said second ground electrode of said first piezoelectric dimorph, said second piezoelectric dimorph being oriented so as to produce motion in said second plane in response to an electrical potential applied across said second active electrode and said second and third ground electrodes; and means for independently controlling an electric field in each of said first and said second piezoelectric dimorphs to produce said independent movement in said first and second piezoelectric dimorphs.

8. A piezoelectric actuator, as set forth in claim 7, wherein said first and second planes are orthogonally disposed.

9. A piezoelectric actuator, as set forth in claim 7, wherein at least one of said first and second piezoelectric dimorphs acts in shear mode.

* * * * *